United States Patent [19]

Hurkx et al.

[11] Patent Number: 5,874,771
[45] Date of Patent: Feb. 23, 1999

[54] PUNCH-THROUGH RESISTOR

[75] Inventors: Godefridus A.M. Hurkx; Catharina H.H. Emons, both of Eindhoven; Willem Van Der Wel, Nijmegen, all of Netherlands

[73] Assignee: U.S. Philips Corporation, New York, N.Y.

[21] Appl. No.: 734,287

[22] Filed: Oct. 21, 1996

[30] Foreign Application Priority Data

Oct. 20, 1995 [EP] European Pat. Off. .............. 95202848

[51] Int. Cl.$^6$ ................................................ H01L 29/8605
[52] U.S. Cl. .......................... 257/536; 257/539; 257/540
[58] Field of Search ..................................... 257/393, 536, 257/540, 543, 539

[56] References Cited

PUBLICATIONS

K.K. Ng, "Complete Guide to Semiconductor Devices, " 1995, pp. 84–89.
S.M. Sze, "Phisics of Semiconductor Devices, " 2nd Ed., 1981, pp. 134, and 613–625.
"Physics of Semiconductor Devices", by S.M. Sze, 2nd Ed., John Wiley & Sons, pp. 352–354.

*Primary Examiner*—John Guay

[57] ABSTRACT

The continuing miniaturization of integrated circuits leads to a demand for ever higher resistance values. In conventional diffused resistors or poly resistors, an increase in the resistance value also means an increase in the surface area. Such resistors, moreover, are highly dependent on the doping concentration and sensitive to temperature changes. A resistor according to the invention comprises a resistor region 18 with a length and doping concentration which are chosen such that an electric field is applied at which velocity saturation of charge carriers takes place in the envisaged range of operation. The connection regions are connected to the resistor region via rectifying junctions 21, 22. In a specific embodiment, these junctions are formed by pn junctions, so that the resistor has, for example, an npn shape. The dimensions are furthermore chosen such that, within said operational range, electrons are injected into the p-type resistor regions by punch-through between the n-type connection regions 19, 20, traversing the resistor region at the saturation velocity. Since the charge carriers supplying the current are of the type opposed to that of the resistor material, it is prevented that the resistance value becomes very low at low voltages.

4 Claims, 3 Drawing Sheets

PUNCH-THROUGH RESISTOR

BACKGROUND OF THE INVENTION

The invention relates to a semiconductor device comprising a semiconductor body provided with a circuit element in the form of an electrical resistor comprising a resistor zone with a comparatively high resistivity between two connection regions with a comparatively low resistivity, the interspacing between the connection regions being so small that velocity saturation of charge carriers takes place in the resistor zone during operation. Such a device is known, for example, from the book "Physics of Semiconductor Devices" by S. M. Sze, 2nd ed., John Wiley & Sons, pp. 352–354. ("Sze")

The demand for compact resistor elements of high resistance value increases continuously in the manufacture of integrated circuits as a result of the continuous reduction of the dimensions of the other components, such as transistors. The transistors, for example, and thus the current through the amplifier become increasingly smaller in a differential amplifier with shared emitters, so that it is necessary to increase the load resistances correspondingly in order to obtain the same amplification. In usual resistor elements, however, an increase in the resistance value means an increase in the space occupied by the resistor elements, which is in conflict with the efforts to obtain ever smaller dimensions. In addition, this increase in the space occupation is accompanied by an increase in the parasitic capacitance, which adversely affects the frequency behaviour of the circuit.

It is furthermore important that the temperature sensitivity of the resistor should be as small as possible. The temperature sensitivity is fairly great in usual resistors in integrated circuits, where the resistor comprises a doped zone or a layer of doped polycrystalline silicon (poly), in the sense that the resistance rises fairly strongly upon a rise in temperature, which causes various properties of the circuit to change. In addition, thermal effects may give rise to temperature gradients across the integrated circuit so that, for example, the ratios between the various resistance values are disturbed such as, for example, in the case of the differential amplifier mentioned above which is so designed that the load resistances are basically identical.

It is also important for many applications that the value of the resistor which is obtained at the end of the manufacturing process should correspond as accurately as possible to a value previously defined in the design of the circuit. When conventional resistor elements are used, the resistance value depends not only on the dimensions, parameters which in general can be well controlled by means of the present-day advanced manufacturing techniques, but also on a quantity such as the net doping concentration, which has a much wider spread. Sze describes a resistor element with reference to FIG. 32 on p. 353 wherein saturation of the drift velocity of charge carriers in a high electric field in the resistor zone is utilized. The device comprises a p-type semiconductor body which is provided at the surface with a comparatively weakly doped n-type resistor zone which is provided on either side with highly-doped n-type connection zones. When the voltage across the resistor is sufficiently high, velocity saturation takes place in the semiconductor material of the resistor. Upon a further increase of the voltage, the current will rise only very little, so that a high (differential) resistance can be obtained. The resistance value obtained in the saturation range is practically independent here of the doping concentration and less dependent on the temperature than in conventional resistors. The resistor in this embodiment behaves as a conventional diffused resistor at lower voltages, with a comparatively low resistance value which is determined by the doping concentration, so that the resistor exhibits the disadvantages described above in this range. A high resistance is often required also at lower voltages, for example in view of a low dissipation.

SUMMARY OF THE INVENTION

The invention has for its object inter alia to provide a device of the kind described in the opening paragraph with a resistor element whose resistance value is determined by velocity saturation of charge carriers at least within a certain operational range and which has a high resistance value at lower voltages. According to the invention, a semiconductor device is for this purpose characterized in that the resistor zone is of a first conductivity type with a comparatively low doping concentration forming a rectifying junction with each of the connection regions, while the application of a voltage between the connection regions causes charge carriers to be injected into the resistor zone by one of the rectifying junctions owing to punch-through between the rectifying junctions at said interspacing between the connection regions and said doping concentration of the resistor zone. When a low voltage is applied between the connection regions, no punch-through will occur so that only a small current will run between the connections. The resistance of the resistor element will thus be very high at such a voltage. Upon an increase in the voltage, the depletion region will expand further into the resistor zone, the junction being reverse biased, so that punch-through can take place at a certain voltage. Given a sufficiently strong electric field in the resistor zone, the relevant charge carriers will flow towards the first connection region mentioned with the saturation velocity. A preferred embodiment is characterized in that the interspacing between the connection regions is chosen such that velocity saturation of the injected charge carriers in the resistor zone takes place at the same voltage between the connection conductors at which punch-through between the rectifying junctions takes place. A further embodiment, which has the advantage that the resistor can be used also at a very low voltage in the saturation range because punch-through takes place already at a voltage practically equal to 0 V, is characterized in that the interspacing between the connection regions is chosen such that the built-in voltages of the junctions are sufficient for depleting the resistor zone over its entire length.

BRIEF DESCRIPTION OF THE DRAWINGS

These and other aspects of the invention will be explained in more detail with reference to a few embodiments. In the drawings.

DETAILED DESCRIPTION OF THE PREFERRED EMBODIMENT

Figure 1:
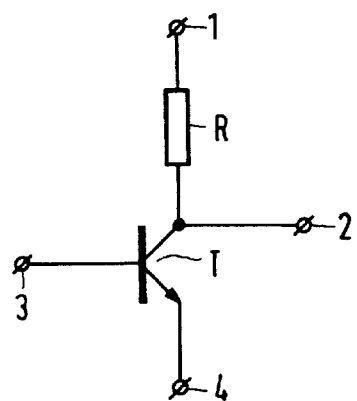
FIG. 1 is a diagram of a transistor provided with a collector series resistor according to the invention.
Figure 2:
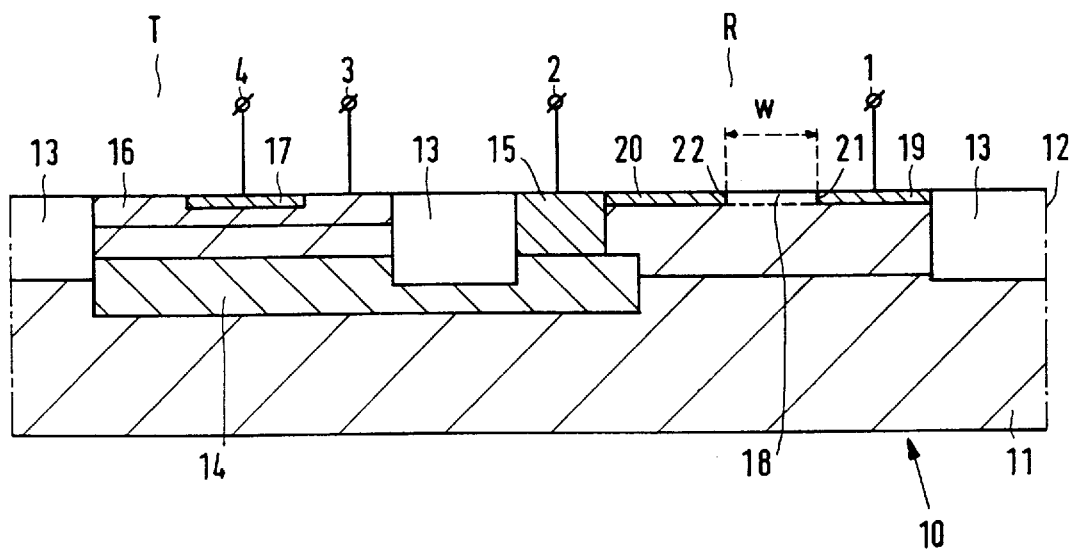
FIG. 2 is a cross-section of an integrated circuit comprising such a transistor and resistor.

FIG. 1 shows a circuit diagram of a transistor T and a series resistor R in the collector path. The transistor and the resistor may form part of a differential amplifier of which only one branch is represented in the drawing, the resistor R forming the collector load resistor and being connected at one side to the collector of the transistor and to an output terminal 2 and at the other side to a terminal 1 to which a voltage, for example the supply voltage, may be applied. The base is connected to an input terminal 3 to which an input signal to be amplified may be supplied. The emitter is connected to a connection terminal 4 to which a low reference voltage, for example ground, may be applied. FIG. 2 shows a cross-section of part of an integrated circuit comprising the transistor T and the resistor R shown in FIG. 1. The device comprises a semiconductor body 10 which is made of silicon in this case, but which may obviously also be made of an alternative suitable semiconductor material. The semiconductor body 10 comprises a p-type substrate 11 having a thickness and doping concentration which are usual for integrated circuits. The surface of the substrate 11 is provided with a p-type epitaxial layer 12 with a thickness of, for example, 3.0 $\mu$m and a doping concentration of, for example, $10^{14}$ atoms per cm$^3$. The epitaxial layer 12 is subdivided into a number of islands, only two of which are shown in FIG. 2, by means of insulating regions 13, for example formed by oxide recessed into the semiconductor body. The island on the left serves mainly to accommodate the transistor T, the island of the right the resistor R. The transistor is of a conventional construction. The collector of the transistor is formed by an n-type buried zone 14 which is provided at the area of the boundary surface between the substrate and the epitaxial layer by means of techniques which are known per se. The buried collector is present not only below the island on the left, but also extends below the deep oxide 13 between the two islands to below the island on the right, where it is connected to the terminal 2 by means of a deep n-type contact zone 15. The base comprises a p-type doped zone 16 provided in the epitaxial layer and connected to the terminal 3. The emitter is formed by the n-type surface zone 17 which is connected to the emitter connection 4. The thickness of the emitter zone 17 is approximately 0.1 $\mu$m.

The resistor R provided in the island on the right comprises a comparatively high-ohmic resistor region 18 which is situated in a portion of the epitaxial layer 12 adjoining the surface. The length of the resistor region is indicated with "w". The resistor region is bounded on either side by a respective connection region 19, 20 of comparatively low resistivity, which regions are conductively connected to the terminals 1, 2, respectively. The interspacing w between the connection regions 19 and 20 is so small that an electric field can be formed in the resistor region 18 of a value where velocity saturation of moving charge carriers takes place. The value of this field is approximately 10 kV per cm for silicon (cf. Sze, p. 352: 30 kV per cm). As described above, such a resistor has the advantage that a high resistance value can be realized in a comparatively small region. Moreover, the dependence on the background concentration and on the temperature is comparatively small, so that it is possible to realize such a resistor with a comparatively high accuracy.

According to the invention, the resistor region 18 is of a first conductivity type and forms rectifying junctions 21, 22 with the respective connection regions 19, 20. In the present example, the connection regions 19 and 20 are formed by strongly doped n-type surface zones which are provided in the epitaxial layer 12, preferably simultaneously with the emitter 17, the resistor region 18 being of the p-type and being formed by a surface region of the epitaxial layer 12. In alternative embodiments, at least one of the rectifying junctions may be formed by a metal-semiconductor junction (Schottky contact). To render it possible to pass a current through the resistor, the interspacing w and the doping concentration in the resistor region 18 are such that, when a voltage is applied between the terminals 1 and 2, the region between the pn junctions is depleted and punch-through takes place between the pn junctions.

The punch-through voltage is determined to a major extent by the interspacing w between the pn junctions 21 and 22. A value is chosen for w which is preferably at most approximately 1 $\mu$m so that the device can also operate at lower voltages.

The following holds for the differential resistance in the saturation range:

$$R = w^2 / 2\epsilon_s v_d A,$$

where $\epsilon_s$, $V_d$, and A are the dielectric constant of silicon, the saturation drift velocity, and the surface area of the cross-section, respectively (cf. e.g. Sze, p. 353). The surface area A is defined by the width of the zones 20 and 21 and the thickness of the space charge region between the zones which is determined by the doping concentrations and in particular by the depth of the zones 21 and 22. In FIG. 2, the thickness of the region 18 is shown to be equal to the depth of the zones 20 and 21 for simplicity's sake; in actual fact the space charge region will be slightly thicker than indicated in the drawing. In a practical realization, the thickness of the emitter 17 and thus of the zones 20 and 21 was approximately 0.1 $\mu$m. The width of the resistor R, i.e. the dimension perpendicular to the plane of drawing, was 1.0 $\mu$m.

Figure 3:
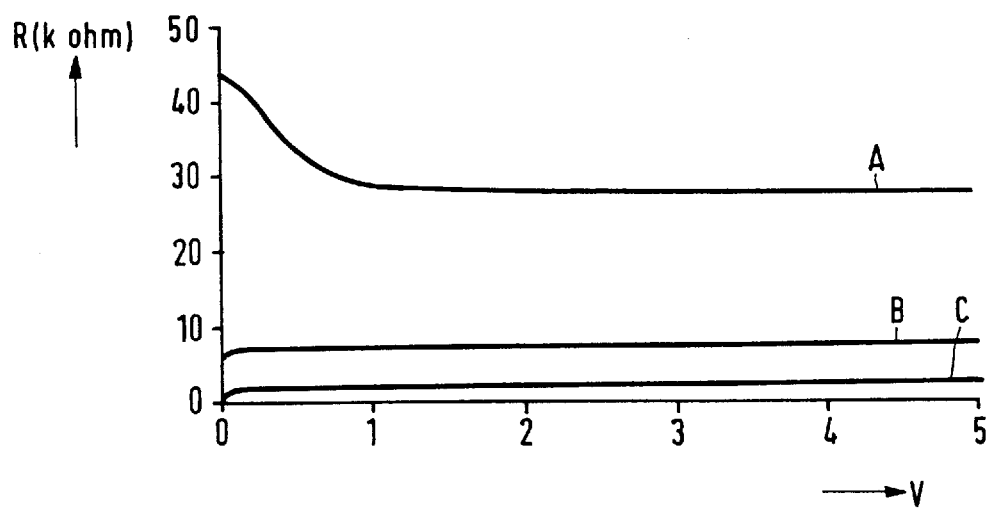
FIG. 3 plots the resistance R as a function of the applied voltage V for various values of the interspacing w between the connection regions.

In FIG. 3, the resistance R is plotted as a function of the voltage V for three different values of the parameter w. In example A, the interspacing w between the connection regions 20 and 21 was approximately 0.8 $\mu$m. The punch-through voltage was approximately 1 V here. Below this voltage the resistance is mainly determined by leakage, and is accordingly comparatively high. Curves B and C show the resistance R for w=0.4 $\mu$m and w=0.2 $\mu$m, respectively. Punch-through takes place at very low voltages already in both situations, i.e. at voltages much lower than 1 V. The resistance R is comparatively high at low voltages in the three situations represented, in contrast to known resistors based on the velocity saturation effect, where the resistor region and the connection regions are of the same conductivity type and where the conduction is ohmic at low voltages.

Figure 4:
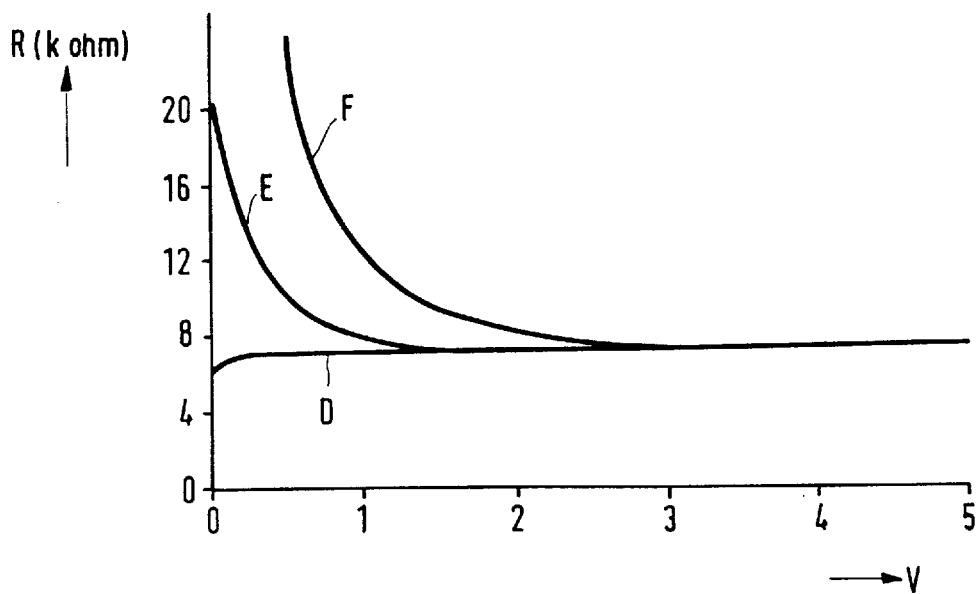
FIG. 4 plots the resistance R as a function of the voltage V for various values of the doping concentration of the epitaxial layer.

FIG. 4 shows the resistance R as a function of the voltage V for different values of the doping concentration in the epitaxial layer 12. The interspacing w is 0.4 $\mu$m in all three cases. Curve D corresponds to curve B in FIG. 3 and shows the resistance R for a doping concentration of approximately $1.10^{14}$ atoms per cm$^3$; and Curve E shows the resistance R for a doping concentration of approximately $3.10^{15}$ atoms per cm$^3$; and curve F shows the resistance R for a concentration of $1.10^6$ atoms per cm$^3$. As the graph shows, the resistance R is practically independent of the background concentration in the epitaxial layer at higher voltages. The punch-through voltage increases at higher doping concentrations, so that the resistance increases with the concentration in the epitaxial layer at low voltages.

The epitaxial layer 12 is of the p-type in the present example. A positive voltage is applied to the n-type zone 19 during operation so that the pn junction 21 is reverse-biased and forward-biases the pn junction 22 via the punch-through mechanism. The island in which the resistor is formed may be kept at an electrically floating potential. If so desired, the island may alternatively be conductively connected to the collector.

Figure 5:
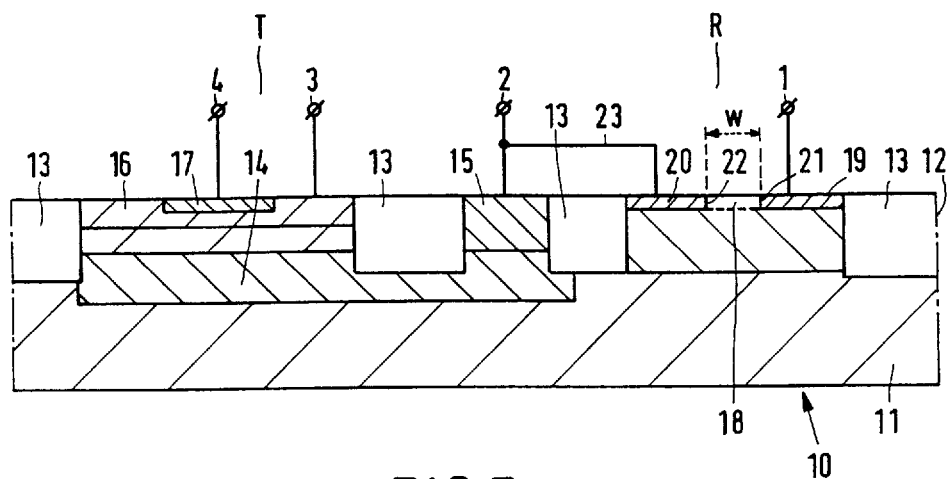
FIG. 5 shows a modification of the embodiment of FIG. 2.

FIG. 5 shows a modification which differs from the embodiment of FIG. 2 mainly in that an epitaxial layer 12 is used which is of the same conductivity type as the collector 14, so the n-type. The resistor region 18 is also of the n-type, while the connection regions 19 and 20 are of the p-type and form respective pn junctions 21 and 22 with the resistor region 18. The resistor R is formed in a separate island, laterally separated from the collector 14, 15 by an oxide region 13. The island may be floating or conductively connected to the connection zone 19, as desired. The connection zone 20 is connected to the collector contact zone 15 and to terminal 2 by means of wiring 23. The pn junction 22 is reverse-biased during operation, so that a depletion region extends from this pn junction into the resistor zone 18 to the pn junction 21, thus forward-biasing the latter pn junction in the punch-through condition.

Figure 6:
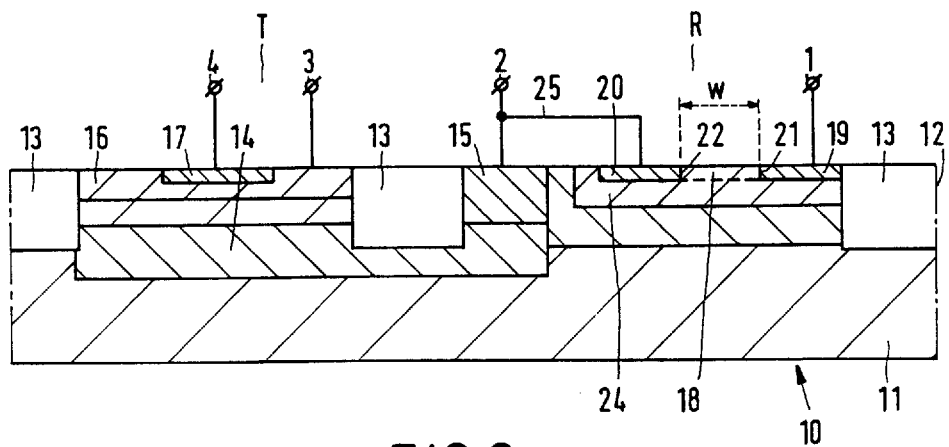
FIG. 6 is a cross-section of a further modification of the embodiment of FIG. 2.

FIG. 6 shows a further modification where again an epitaxial layer of the n-type is used and the resistor is provided in the same island as the collector connection 15. The resistor zone 18 is formed by a surface region of a p-type surface zone 24 provided with the n-type connection regions 19 and 20. The connection zone 19 is connected to the connection terminal 1 to which the positive supply voltage is applied. The connection zone 20 is conductively connected to the collector of the transistor and to connection terminal 2. The connection is diagrammatically represented with wiring 25, but it will be obvious that this connection may alternatively be obtained in that the zone 20 extends to beyond the edge of the p-type zone 24. The zone 24 may be floating, or may alternatively be conductively connected to the connection zone 20. The reverse-biased pn junction 21 puts the pn junction 22 into the forward-biased state by punch-through during operation.

Figure 7:
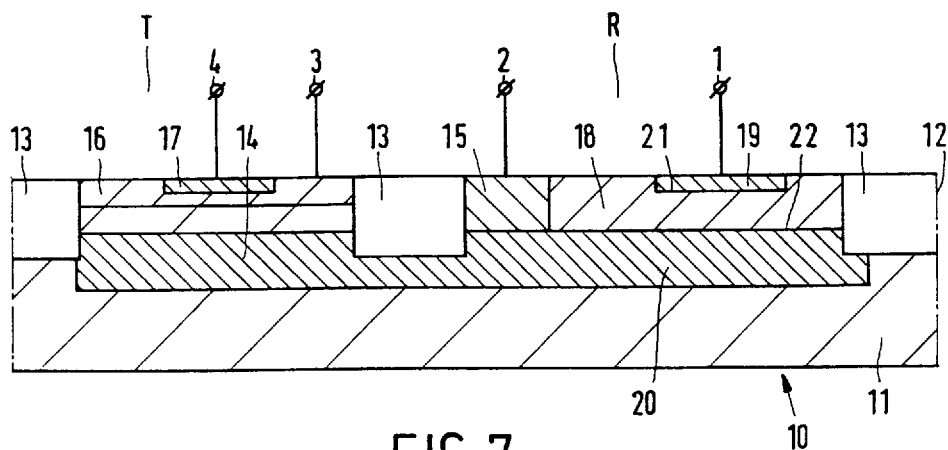
FIG. 7 is a cross-section of a different embodiment of a device according to the invention.

In the examples described hitherto, the current flows through the resistor R in lateral direction, the interspacing w being defined by the distance between two surface zones. FIG. 7 shows an embodiment of a vertical resistor. The semiconductor body 10 in this example is of the same composition as in the example of FIG. 2, with an epitaxial layer of the p-type. The n-type connection zone of the resistor R is formed, as in FIG. 2, by an n-type surface zone provided in the epitaxial layer and connected to the connection terminal 1. The other connection zone of the resistor is formed by an n-type buried zone 22 which forms a pn junction 22 with the p-type epitaxial layer 12. The zone 20 further forms a common buried layer with the collector 14 and is conductively connected to the connection terminal 12 via the n-type collector contact zone 15. The buried zone 20 extends to below the zone 19 and together with the zone 19 defines an interposed portion 18 of the p-type epitaxial layer which forms the resistor zone of the resistor R. The current flowing through the resistor 18 during operation is formed by electrons injected into the p-type region 18 by the pn junction 22 as a result of punch-through from junction 21 to junction 22. The resistance value depends on the interspacing between the surface zone 19 and the buried zone 20. This value further depends on the surface area of the zone 19 and may as a result be substantially smaller than in the embodiment of FIG. 2 where the resistance value for a given depth of the zone 19 can be adjusted mainly through adjustment of the length of the zones 19, 20.

The above examples all comprise a combination of a resistor and a bipolar transistor. The resistor may also be used, as will be obvious, in MOST circuits or BICMOS circuits. The resistor may then be manufactured in the form of a MOS transistor whose gate is not used for switching purposes. In a first embodiment, the gate may then not be connected at all. In an alternative embodiment, a suitable voltage may be applied to the gate whereby inversion takes place at the surface below the gate at the source side to increase the linearity of the resistor.

It will furthermore be obvious that the invention is not limited to the embodiments described here, but that many more variations are possible to those skilled in the art within the scope of the invention. Thus the conductivity types may be reversed in the embodiments described. It is also possible to use a Schottky junction instead of a pn junction for the rectifying junction between the resistor region and the connection regions.

What is claimed is:

1. A semiconductor device comprising a semiconductor body provided with a circuit element in the form of an electrical resistor comprising a resistor zone with a comparatively high resistivity between two connection regions with a comparatively low resistivity, the interspacing between the connection regions being so small that velocity saturation of charge carriers takes place in the resistor zone during operation, characterized in that the resistor zone is of a first conductivity type with a comparatively low doping concentration forming a rectifying junction with each of the connection regions, while the application of a voltage between the connection regions causes charge carriers to be injected into the resistor zone by one of the rectifying junctions owing to punch-through between the rectifying junctions, at said interspacing between the connection regions and said doping concentration of the resistor zone, the interspacing between the connection regions is chosen such that velocity saturation of the injected charge carriers in the resistor zone takes place at the same voltage between the connection conductors at which punch-through between the rectifying junctions takes place and the interspacing between the connection regions is chosen such that the built-in voltages of the junctions are sufficient for depleting the resistor zone over at least substantially its entire length.

2. A semiconductor device as claimed in claim 1, characterized in that the semiconductor body is made of silicon, the resistor zone being of the p-type and the connection zones each being of the n-type, while the rectifying junctions are formed by the pn junctions between the resistor zone and the connection regions.

3. A semiconductor device as claimed in claim 2, characterized in that the interspacing between the pn junctions is at most 1 $\mu$m.

4. A semiconductor device as claimed in claim 3, characterized in that the interspacing between the pn junctions is at most 0.5 $\mu$m.

\* \* \* \* \*